United States Patent
Kato et al.

(10) Patent No.: US 9,365,681 B2
(45) Date of Patent: *Jun. 14, 2016

(54) WAFER PROCESSING LAMINATE, WAFER PROCESSING MEMBER, TEMPORARY BONDING ARRANGEMENT, AND THIN WAFER MANUFACTURING METHOD

(71) Applicant: SHIN-ETSU CHEMICAL CO., LTD., Tokyo (JP)

(72) Inventors: Hideto Kato, Annaka (JP); Michihiro Sugo, Annaka (JP); Shohei Tagami, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 267 days.

This patent is subject to a terminal disclaimer.

(21) Appl. No.: 13/659,168

(22) Filed: Oct. 24, 2012

(65) Prior Publication Data

US 2013/0108866 A1    May 2, 2013

(30) Foreign Application Priority Data

Oct. 28, 2011    (JP) .................................. 2011-236960

(51) Int. Cl.
*C08G 77/04*    (2006.01)
*C08G 77/52*    (2006.01)
*C09D 183/14*    (2006.01)
(Continued)

(52) U.S. Cl.
CPC ............... *C08G 77/04* (2013.01); *C08G 77/52* (2013.01); *C08L 83/14* (2013.01); *C09D 183/14* (2013.01); *H01L 21/6835* (2013.01); *C08G 77/12* (2013.01); *C08G 77/14* (2013.01); *H01L 2221/6834* (2013.01); *H01L 2221/68327* (2013.01); *H01L 2221/68381* (2013.01); *Y10T 428/2848* (2015.01); *Y10T 428/31511* (2015.04); *Y10T 428/31663* (2015.04)

(58) Field of Classification Search
None
See application file for complete search history.

(56) References Cited

U.S. PATENT DOCUMENTS 5,804,631 A  * 9/1998 Mine .................. C08K 3/08
                                                    257/783
6,325,885 B1 * 12/2001 Harrison .................. 156/306.3
(Continued)

FOREIGN PATENT DOCUMENTS

EP    1 496 547 A2    1/2005
JP    2004-064040 A    2/2004
(Continued)

OTHER PUBLICATIONS

Extended European Search Report dated May 10, 2013, issued in corresponding European Patent Application No. 12190089.8 (6 pages).

*Primary Examiner* — Scott R Walshon
(74) *Attorney, Agent, or Firm* — Westerman, Hattori, Daniels & Adrian, LLP

(57) ABSTRACT

A wafer processing laminate is provided comprising a support, a temporary adhesive layer on the support, and a wafer laid on the temporary adhesive layer. The temporary adhesive layer has a trilayer structure consisting of a first bond layer (A) of thermoplastic organosiloxane polymer which is releasably bonded to the circuit-forming front surface of the wafer, a second bond layer (B) of thermosetting modified siloxane polymer which is laid on the first bond layer, and a third bond layer (A') of thermoplastic organosiloxane polymer which is laid on the second bond layer and releasably bonded to the support.

15 Claims, 1 Drawing Sheet

(51) Int. Cl.
*C08L 83/14* (2006.01)
*H01L 21/683* (2006.01)
*C08G 77/12* (2006.01)
*C08G 77/14* (2006.01)

(56) References Cited

U.S. PATENT DOCUMENTS

| | | | |
|---|---|---|---|
| 6,512,037 B1* | 1/2003 | Ahn | C08K 5/0091 524/413 |
| 7,541,264 B2 | 6/2009 | Gardner et al. | |
| 2005/0215030 A1* | 9/2005 | Yamamoto | 438/458 |
| 2005/0233547 A1 | 10/2005 | Noda et al. | |
| 2008/0182087 A1* | 7/2008 | Kato et al. | 428/195.1 |
| 2008/0226884 A1 | 9/2008 | Sim et al. | |
| 2010/0330780 A1 | 12/2010 | Hwang et al. | |
| 2012/0034437 A1 | 2/2012 | Puligadda et al. | |
| 2012/0175045 A1* | 7/2012 | Furuya | H01L 21/6835 156/154 |

FOREIGN PATENT DOCUMENTS

| | | |
|---|---|---|
| JP | 2006-328104 A | 12/2006 |
| WO | 2004/006296 A2 | 1/2004 |

\* cited by examiner

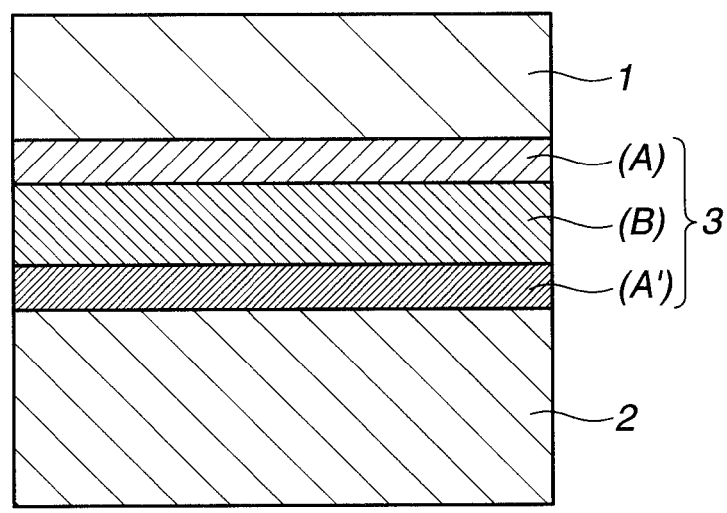

WAFER PROCESSING LAMINATE, WAFER PROCESSING MEMBER, TEMPORARY BONDING ARRANGEMENT, AND THIN WAFER MANUFACTURING METHOD

CROSS-REFERENCE TO RELATED APPLICATION

This non-provisional application claims priority under 35 U.S.C. §119(a) on Patent Application No. 2011-236960 filed in Japan on Oct. 28, 2011, the entire contents of which are hereby incorporated by reference.

TECHNICAL FIELD

This invention relates to a wafer processing laminate, wafer processing member and temporary bonding arrangement allowing for processing the wafer, and a method for manufacturing a thin wafer.

BACKGROUND ART

Three-dimensional semiconductor packages become essential for a higher density and capacity. The 3D semiconductor packaging technology is by thinning semiconductor chips, and stacking them in multilayer structure while providing through-silicon via (TSV) interconnects. Fabrication of such packages requires the steps of thinning a substrate having a semiconductor circuit formed therein by grinding its non-circuit forming surface or back surface, and forming TSV and electrodes on the back surface. In the prior art, prior to the step of grinding the back surface of a silicon substrate, a protective tape is attached to the surface of the substrate opposite to the surface to be ground for preventing the wafer from breakage during the grinding step. Since the protective tape is based on an organic resin film, it is flexible, but has insufficient strength and heat resistance to withstand the TSV forming step and the step of forming interconnects on the back surface.

It is then proposed to bond a semiconductor substrate to a support of silicon or glass, for example, via an adhesive layer. The resulting system is sufficient to withstand the steps of grinding the back surface and forming TSV and electrodes on the back surface. The adhesive layer for bonding the substrate to the support is critical for this system. The adhesive layer must bond the substrate to the support without leaving gaps, be durable enough to withstand the subsequent steps, and eventually allow the thin wafer to be readily released from the support. The adhesive layer is referred herein to as "temporary adhesive layer" since it is finally removed.

With regard to temporary adhesive layers and removal thereof, Patent Document 1 discloses a layer of an adhesive composition containing a light absorbing agent. The adhesive layer is irradiated with high intensity light for decomposing the adhesive composition so that the layer may be removed. Patent Document 2 discloses a layer of an adhesive composition comprising a heat melting hydrocarbon compound, wherein the layer can be bonded and released in the heat molten condition. The former technology requires an expensive tool such as laser, a particular substrate (typically glass substrate) that is transmissive to laser light as the support, and a longer time of treatment per substrate. The latter technology is simple because of control only by heat, but is applicable to a limited range because of instability at high temperatures in excess of 200° C. These temporary adhesive layers are not adequate to form a layer of uniform thickness on a heavily stepped substrate and to provide a complete bond to the support.

Patent Document 3 discloses the use of a silicone pressure-sensitive adhesive composition as the temporary adhesive layer. A substrate is bonded to a support with an addition reaction curable silicone adhesive composition. On removal, the assembly is immersed in an etching solution capable of dissolving or decomposing the silicone resin, whereby the substrate is separated from the support. This method takes a very long time for removal and is applicable to the commercial manufacture process with difficulty.

CITATION LIST

Patent Document 1: JP-A 2004-64040 (U.S. Pat. No. 7,534,498, EP 1550156)
Patent Document 2: JP-A 2006-328104
Patent Document 3: U.S. Pat. No. 7,541,264

SUMMARY OF INVENTION

An object of the invention is to provide a wafer processing laminate, wafer processing member or temporary bonding arrangement, which facilitates to establish a temporary bond between a wafer and a support, enables to form an adhesive layer of uniform thickness even on a heavily stepped substrate, is compatible with the TSV forming and back surface interconnect forming steps, allows for easy removal, and offers high productivity. Another object is to provide a method for manufacturing a thin wafer using the laminate, member or arrangement.

The inventors have found that when a temporary bond arrangement of tri-layer system consisting of (A) a first temporary bond layer of a thermoplastic organopolysiloxane having a high degree of polymerization, (B) a second temporary bond layer of thermosetting modified siloxane polymer, and (A') a third temporary bond layer of a thermoplastic organopolysiloxane having a high degree of polymerization is used to establish a bond between a wafer and a support, a thin wafer having a TSV structure or bump interconnect structure can be easily manufactured.

In a first aspect, the invention provides a wafer processing laminate comprising a support, a temporary adhesive layer on the support, and a wafer laid contiguous to the temporary adhesive layer, the wafer having a circuit-forming front surface and a back surface to be processed. The temporary adhesive layer comprises a composite temporary adhesive unit having a trilayer structure consisting of a first temporary bond layer (A) of thermoplastic organosiloxane polymer which is releasably bonded to the front surface of the wafer, a second temporary bond layer (B) of thermosetting modified siloxane polymer which is laid contiguous to the first temporary bond layer, and a third temporary bond layer (A') of thermoplastic organosiloxane polymer which is laid contiguous to the second temporary bond layer and releasably bonded to the support.

In a second aspect, the invention provides a wafer processing member comprising a support and a temporary adhesive layer on the support, wherein a wafer having a circuit-forming front surface and a back surface to be processed will be temporarily bonded to the temporary adhesive layer. The temporary adhesive layer comprises a third temporary bond layer (A') of thermoplastic organosiloxane polymer which is releasably bonded to the support, a second temporary bond layer (B) of thermosetting modified siloxane polymer which is laid contiguous to the third temporary bond layer, and a first temporary bond layer (A) of thermoplastic organosiloxane polymer which is laid contiguous to the second temporary bond layer and which can be releasably bonded to the front surface of the wafer.

In a third aspect, the invention provides an arrangement for temporarily bonding a wafer to a support for wafer processing, the wafer having a circuit-forming front surface and a back surface to be processed. The temporary bonding arrangement consists of a first temporary bond layer (A) of thermoplastic organosiloxane polymer which can be releasably bonded to the front surface of the wafer, a second temporary bond layer (B) of thermosetting modified siloxane polymer which is laid contiguous to the first temporary bond layer, and a third temporary bond layer (A') of thermoplastic organosiloxane polymer which is laid contiguous to the second temporary bond layer and which can be releasably bonded to the support.

In a preferred embodiment, the first and third temporary bond layers (A) and (A') each comprise a non-reactive organopolysiloxane consisting of 99.000 to 99.999 mol % of difunctional siloxane units of $R^{11}R^{12}SiO_{2/2}$, 1.000 to 0.001 mol % of monofunctional siloxane units of $R^{13}R^{14}R^{15}SiO_{1/2}$, and 0.000 to 0.500 mol % of trifunctional siloxane units of $R^{16}SiO_{3/2}$, wherein $R^{11}$, $R^{12}$, $R^{13}$, $R^{14}$, $R^{15}$, and $R^{16}$ are each independently a substituted or unsubstituted monovalent hydrocarbon group, having a weight average molecular weight of 200,000 to 1,000,000, and containing up to 0.5% by weight of a low molecular fraction having a molecular weight of up to 740.

In a preferred embodiment, the second temporary bond layer (B) is a cured layer of a composition comprising 100 parts by weight of a thermosetting modified siloxane polymer which is a silphenylene-containing polymer comprising recurring units of the general formula (1) and having a weight average molecular weight of 3,000 to 500,000 or an epoxy-containing silicone polymer comprising recurring units of the general formula (2) and having a weight average molecular weight of 3,000 to 500,000, and 0.1 to 50 parts by weight of a crosslinker which is selected from the group consisting of an amino condensate modified with formalin or formalin-alcohol, a melamine resin, a urea resin, a phenol compound having on average at least two methylol or alkoxymethylol groups per molecule, and an epoxy compound having on average at least two epoxy groups per molecule,

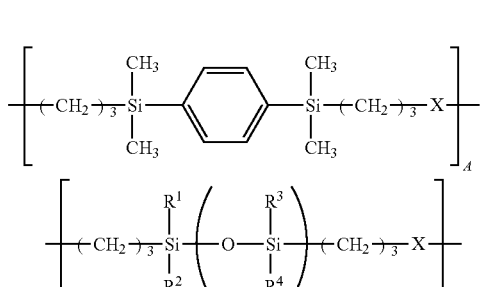

(1)

wherein $R^1$ to $R^4$ are each independently a monovalent hydrocarbon group of 1 to 8 carbon atoms, m is an integer of 1 to 100, A is a positive number, B is 0 or a positive number, X is a divalent organic group having the general formula (3):

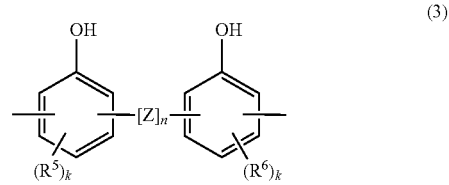

(3)

wherein Z is a divalent organic group selected from the following:

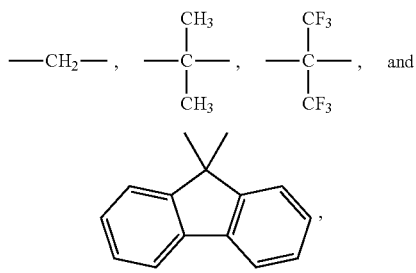

n is 0 or 1, $R^5$ and $R^6$ are each independently an alkyl or alkoxy group of 1 to 4 carbon atoms, and k is 0, 1 or 2,

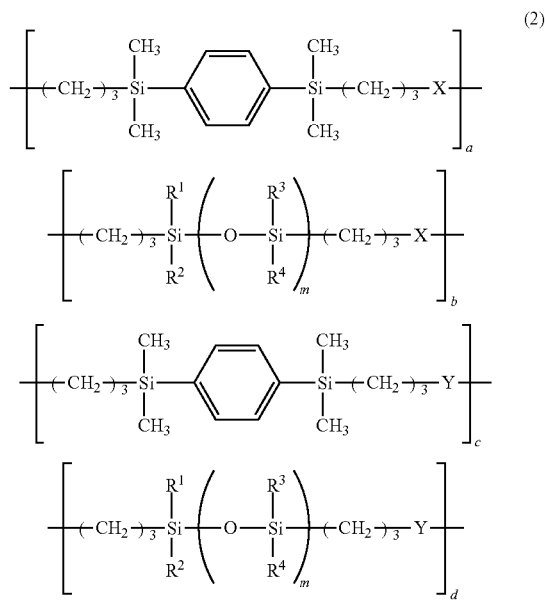

(2)

wherein $R^1$ to $R^4$ are each independently a monovalent hydrocarbon group of 1 to 8 carbon atoms, m is an integer of 1 to 100, a, b, c and d each are 0 or a positive number, with the proviso that c and d are not equal to 0 at the same time, and $0<(c+d)/(a+b+c+d)\le 1.0$, X is a divalent organic group having the general formula (3):

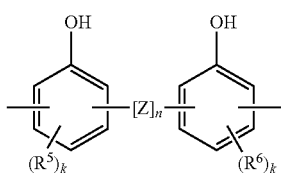
(3)

wherein Z is a divalent organic group selected from the following:

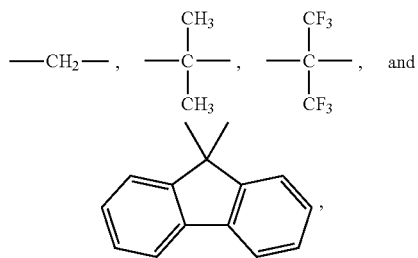
and n is 0 or 1, $R^5$ and $R^6$ are each independently an alkyl or alkoxy group of 1 to 4 carbon atoms, and k is 0, 1 or 2, and Y is a divalent organic group having the general formula (4):

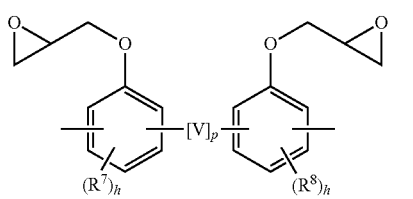
(4)

wherein V is a divalent organic group selected from the following:

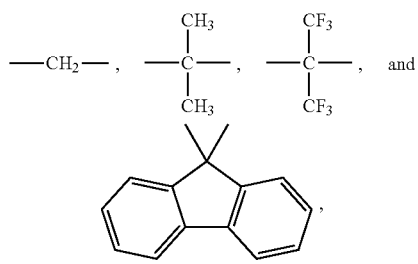
and p is 0 or 1, $R^7$ and $R^8$ are each independently an alkyl or alkoxy group of 1 to 4 carbon atoms, and h is 0, 1 or 2.

In a fourth aspect, the invention provides a method for manufacturing a thin wafer, comprising the steps of:

(a) releasably bonding a wafer to a support via a composite temporary bonding arrangement having a trilayer structure consisting of bond layers (A), (B) and (A') as defined above, the wafer having a circuit-forming front surface and a non-circuit-forming back surface, with the circuit-forming surface facing the support, (b) grinding the non-circuit-forming surface of the wafer bonded to the support, (c) processing the non-circuit-forming surface of the wafer, (d) releasing the processed wafer from the support, and (e) optionally removing any bond layer from the circuit-forming surface of the wafer.

Alternatively, step (a) is by forming bond layer (A) as defined above on the circuit-forming surface of the wafer, successively forming bond layers (A') and (B) as defined above on a support, and bonding bond layer (A) and bond layer (B) for thereby bonding the wafer and the support together.

In the method for manufacturing a thin wafer, by bonding a wafer to a support via a bonding arrangement consisting of bond layers (A), (B) and (A') as defined above to construct a laminate, the wafer having a circuit-forming front surface and a non-circuit-forming back surface, with the circuit-forming front surface of the wafer facing the support, processing the wafer, and releasing the processed wafer from the support, the step (d) of releasing the processed wafer from the support may include (d-1) attaching a dicing tape to the processed surface of the wafer, (d-2) vacuum chucking the dicing tape-attached surface to a chuck surface, (d-3) releasing the support from the processed wafer by peel-off while keeping the chuck surface at a temperature in the range of 10 to 100° C., and (d-4) removing any bond layer from the circuit-forming surface of the wafer.

Advantageous Effects of Invention

The temporary adhesive layer is applicable to a wide range of semiconductor film forming process because of high heat resistance. An adhesive layer of uniform thickness can be formed even on a stepped wafer. By virtue of thickness uniformity of the adhesive layer, a uniform thin wafer of up to 50 μm can be readily manufactured. After a thin wafer is manufactured, the wafer can be readily removed from the support at room temperature. Another advantage is ease of handling of a thin wafer despite its fragility.

BRIEF DESCRIPTION OF DRAWING

FIG. 1 is a cross-sectional view of a wafer processing laminate in one embodiment of the invention.

DESCRIPTION OF PREFERRED EMBODIMENT

In one embodiment of the invention, a laminate for wafer processing is shown in FIG. 1 as comprising a wafer 1 to be processed, a support 2 for carrying the wafer 1 during its processing, and a temporary adhesive layer (or temporary bonding arrangement) 3 intervening between the wafer 1 and the support 2. The wafer 1 has a circuit-forming front surface and a back surface to be processed. The temporary bonding arrangement 3 has a trilayer structure unit consisting of (A) a first temporary bond layer of thermoplastic organopolysiloxane, (B) a second temporary bond layer of thermosetting modified siloxane polymer, and (A') a third temporary bond layer of thermoplastic organopolysiloxane. The first temporary bond layer (A) is releasably bonded to the front surface of the wafer 1. The third temporary bond layer (A') is releasably bonded to the support 2.

Another embodiment is a member for wafer processing, comprising the substrate 2, the thermoplastic organopolysiloxane layer (A') on substrate 2, the thermosetting modified siloxane polymer layer (B) on layer (A'), and the thermoplastic organopolysiloxane layer (A) on layer (B). A further embodiment is a temporary bonding arrangement for wafer processing which consists of layers (A), (B), and (A').
[Temporary Adhesive Layer]
First and Third Temporary Bond Layers (A) and (A')

The first and third temporary bond layers (A) and (A') are of thermoplastic organopolysiloxane. Specifically, the temporary bond layers (A) and (A') each comprise a non-reactive organopolysiloxane consisting of 99.000 to 99.999 mol %, preferably 99.500 to 99.999 mol % of siloxane units of $R^{11}R^{12}SiO_{2/2}$ which are known as difunctional or D units, 1.000 to 0.001 mol %, preferably 0.500 to 0.001 mol % of siloxane units of $R^{13}R^{14}R^{15}SiO_{1/2}$, which are known as monofunctional or M units, and 0.000 to 0.500 mol %, preferably 0.000 to 0.100 mol % of siloxane units of $R^{16}SiO_{3/2}$, which are known as trifunctional or T units, having a weight average molecular weight of 200,000 to 1,000,000, and containing up to 0.5% by weight of a low molecular fraction having a molecular weight of up to 740. The layers (A) and (A') may be the same or different.

In the formulae, the organic substituent groups $R^{11}$, $R^{12}$, $R^{13}$, $R^{14}$, $R^{15}$, and $R^{16}$, which may be the same or different, are substituted or unsubstituted monovalent hydrocarbon groups of 1 to 10 carbon atoms, for example, alkyl groups such as methyl, ethyl, n-propyl, isopropyl, n-butyl, t-butyl, n-pentyl, cyclopentyl, and n-hexyl, cycloalkyl groups such as cyclohexyl, aryl groups such as phenyl and tolyl, and substituted forms of the foregoing in which some or all hydrogen atoms are substituted by halogen atoms. Inter alia, methyl and phenyl are preferred.

The organopolysiloxane should have a weight average molecular weight (Mw) of at least 200,000, preferably at least 350,000, and up to 1,000,000, preferably up to 800,000. It is noted that Mw is measured by gel permeation chromatography (GPC) versus polystyrene standards. The content of a low molecular fraction having a molecular weight of up to 740 is up to 0.5% by weight, preferably up to 0.1% by weight. If Mw of the organopolysiloxane is less than 200,000, the laminate may not withstand the grinding step for thinning of a wafer. If Mw exceeds 1,000,000, the polymer may not be washed away in the cleaning step subsequent to the relevant process. If the content of a low molecular fraction having a molecular weight of up to 740 exceeds 0.5% by weight, the polymer may have insufficient heat resistance against heat treatment during TSV formation or heat treatment of bump electrodes on wafer back surface.

D units account for 99.000 to 99.999 mol % of the resin. If the content of D units is less than 99.000 mol %, the resin may not withstand the grinding step for thinning of a wafer. If the content of D units exceeds 99.999 mol %, the layer (A) may not be released from the wafer after the completion of the process.

M units are added to cap the active group at the end of a resin composed mainly of D units and used for adjusting the molecular weight thereof.

The thermoplastic organopolysiloxane layer may be preformed as a film, which may be attached to the wafer using a roll laminator or the like. Alternatively, the thermoplastic organopolysiloxane layer may be formed on the wafer by applying a solution of organopolysiloxane by a suitable coating technique such as spin coating or roll coating. In the latter case of forming layer (A) on the wafer or forming layer (A') on the support or layer (B) by a coating technique such as spin coating, a solution of the resin is preferably prepared prior to coating. To this end, hydrocarbon solvents such as pentane, hexane, cyclohexane, decane, isododecane and limonene are preferably used. Any well-known antioxidants may be added to the thermoplastic organopolysiloxane solution for enhancing heat resistance. The layer (A) or (A') has a thickness in the range of 0.1 to 10 μm. If the layer (A) or (A') is less than 0.1 μm, it may fail to cover steps on the device wafer or lack durability as film. If the layer (A) or (A') is more than 10 μm, it may not withstand the grinding step in the manufacture of a thin wafer. Besides, a filler such as silica may be added to the thermoplastic siloxane for enhancing heat resistance. Specifically up to 50 parts by weight of the filler may be added to 100 parts by weight of the inert organopolysiloxane.

Second Temporary Bond Layer (B)

The second temporary bond layer (B) is of thermosetting modified siloxane polymer. Specifically, the second temporary bond layer (B) is a cured layer of a thermosetting composition composed mainly of a thermosetting modified siloxane polymer of the general formula (1) or (2).

In one embodiment, the thermosetting modified siloxane polymer is a silphenylene-containing polymer comprising recurring units of the general formula (1) and having a weight average molecular weight of 3,000 to 500,000.

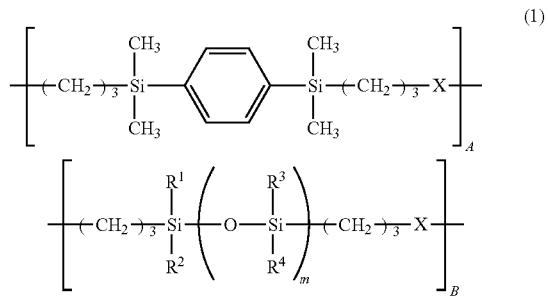

Herein $R^1$ to $R^4$ are each independently a monovalent hydrocarbon group, typically alkyl, of 1 to 8 carbon atoms. The subscript m is an integer of 1 to 100, A is a positive number, and B is 0 or a positive number. X is a divalent organic group having the general formula (3):

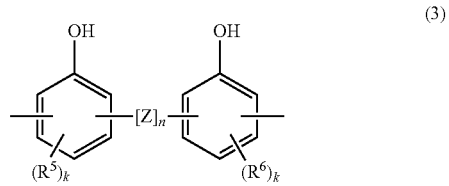

wherein Z is a divalent organic group selected from the following:

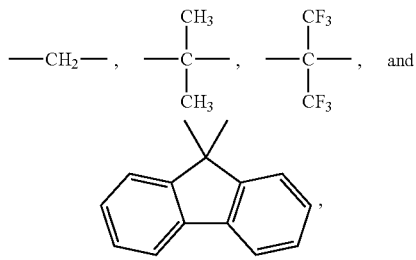

n is 0 or 1, $R^5$ and $R^6$ are each independently an alkyl or alkoxy group of 1 to 4 carbon atoms, and k is 0, 1 or 2.

Suitable groups of $R^1$ to $R^4$ include methyl, ethyl and phenyl. The subscript m is preferably an integer of 3 to 60, more preferably 8 to 40. A and B are preferably such numbers as to give a ratio B/A of 0/1 to 20/1, more preferably 0.5/1 to 5/1.

In another embodiment, the thermosetting modified siloxane polymer is an epoxy-containing silicone polymer comprising recurring units of the general formula (2) and having a weight average molecular weight of 3,000 to 500,000.

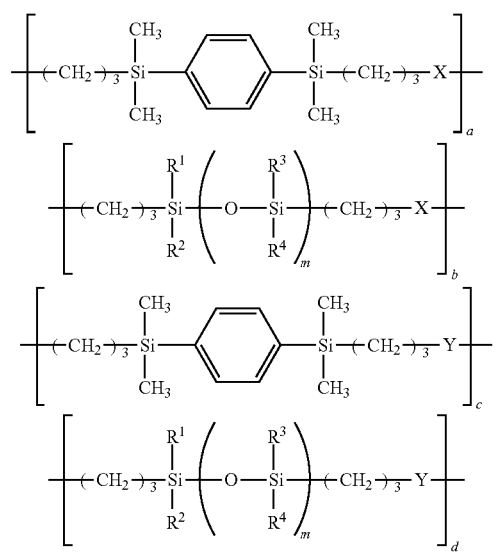
(2)

Herein $R^1$ to $R^4$ are each independently a monovalent hydrocarbon group, typically alkyl, of 1 to 8 carbon atoms, m is an integer of 1 to 100, a, b, c and d each are 0 or a positive number, with the proviso that c and d are not equal to 0 at the same time, and $0<(c+d)/(a+b+c+d)\leq 1.0$, preferably $0.1\leq(c+d)/(a+b+c+d)\leq 0.8$. X is a divalent organic group having the general formula (3):

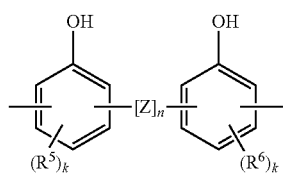
(3)

wherein Z is a divalent organic group selected from the following:

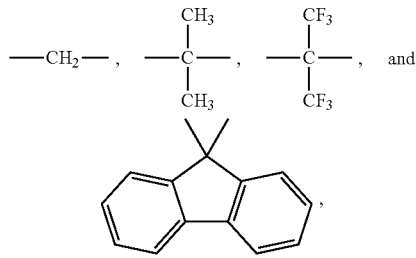

n is 0 or 1, $R^5$ and $R^6$ are each independently an alkyl or alkoxy group of 1 to 4 carbon atoms, and k is 0, 1 or 2. Y is a divalent organic group having the general formula (4):

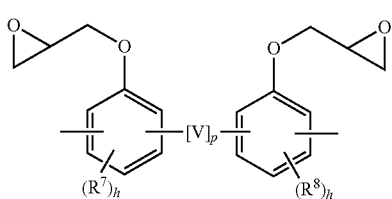
(4)

wherein V is a divalent organic group selected from the following:

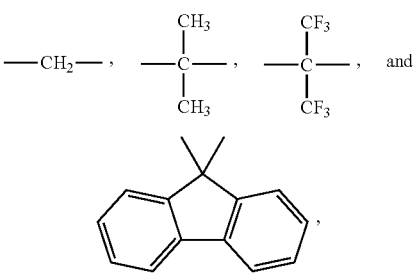

p is 0 or 1, $R^7$ and $R^8$ are each independently an alkyl or alkoxy group of 1 to 4 carbon atoms, and h is 0, 1 or 2. Exemplary groups of $R^1$ to $R^4$ and suitable values of m are as described above.

The thermosetting composition composed mainly of the thermosetting modified siloxane polymer of formula (1) or (2) defined above contains a crosslinker for the thermosetting purpose. The crosslinker is selected from among an amino condensate modified with formalin or formalin-alcohol, a melamine resin, a urea resin, a phenol compound having on average at least two methylol or alkoxymethylol groups per molecule, and an epoxy compound having on average at least two epoxy groups per molecule.

Preferred are multi-functional crosslinkers having a functionality of 2, 3, 4 or more, specifically epoxy resins, for example, commercially available under the trade name of EOCN-1020, EOCN-102S, XD-1000, NC-2000-L, EPPN-201, GAN and NC6000 from Nippon Kayaku Co., Ltd., and crosslinkers of the following formulae.

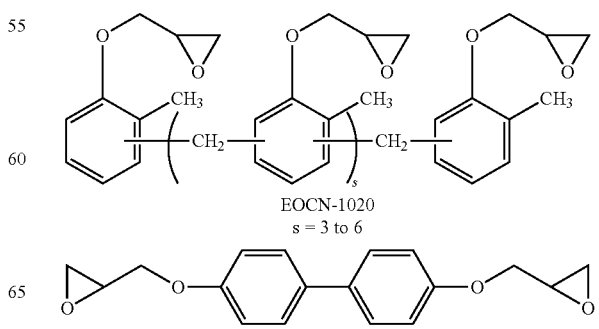
EOCN-1020
s = 3 to 6

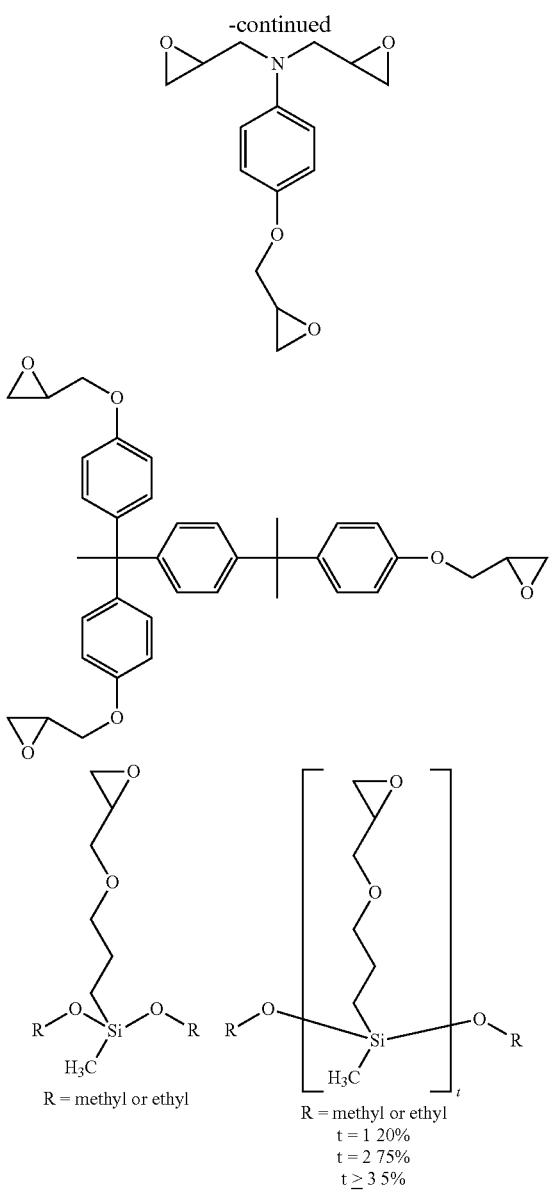

The crosslinker is added in an amount of 0.1 to 50 parts, preferably 0.1 to 30 parts, and more preferably 1 to 20 parts by weight per 100 parts by weight of the thermosetting modified siloxane polymer. More than one crosslinker may be added in admixture.

To the composition, a curing catalyst such as acid anhydride may be added in an amount of up to 10 parts by weight per 100 parts by weight of the thermosetting modified siloxane polymer.

The composition may be pre-formed as a film, which may be attached to either layer (A) on the wafer or layer (A') on the support. Alternatively, the composition may be dissolved in a solvent to form a solution which is applied to layer (A) or (A') by a suitable coating technique such as spin coating, roll coating or die coating. Examples of the solvent used herein include ketones such as cyclohexanone, cyclopentanone, and methyl-2-n-amylketone, alcohols such as 3-methoxybutanol, 3-methyl-3-methoxybutanol, 1-methoxy-2-propanol, and 1-ethoxy-2-propanol, ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether, and esters such as propylene glycol monomethyl ether acetate (PGMEA), propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, propylene glycol mono-tert-butyl ether acetate, and γ-butyrolactone, which may be used alone or in admixture.

Notably, any well-known antioxidants and fillers such as silica may be added to the composition in an amount of up to 50 parts by weight per 100 parts by weight of the thermosetting modified siloxane polymer for further enhancing heat resistance.

The second temporary bond layer (B) is preferably deposited such that the cured thickness is in the range of 10 to 200 μm, more preferably 20 to 120 μm. If the layer (B) is less than 10 μm, it may not withstand the grinding step for the thinning of a wafer. If the layer (B) is more than 200 it may undergo deformation during the heat treatment step such as TSV forming step, which is practically unacceptable.

[Thin Wafer Manufacturing Method]

A further embodiment of the invention is a method for manufacturing a thin wafer, which is characterized in that a temporary adhesive layer consisting of three layers, layers (A), (B) and (A') defined above is used as a bond layer between a wafer (having a semiconductor circuit formed therein) and a support. The thin wafer manufactured by the method typically has a thickness of 5 to 300 μm, more typically 10 to 100 μm.

The method for manufacturing a thin wafer is defined as comprising the steps of (a) releasably bonding a wafer to a support via a temporary bonding arrangement consisting of bond layers (A), (B) and (A') defined above, the wafer having a circuit-forming front surface and a non-circuit-forming back surface, with the circuit-forming surface facing the support, (b) grinding the non-circuit-forming surface of the wafer bonded to the support, (c) processing the non-circuit-forming surface of the wafer, (d) releasing the processed wafer from the support, and (e) optionally removing any bond layer from the circuit-forming surface of the wafer.

Step (a)

A wafer having a circuit-forming front surface and a non-circuit-forming back surface is provided. In step (a), the circuit-forming surface of the wafer is bonded to a support via a temporary bonding arrangement consisting of three layers, layers (A), (B) and (A') defined above, yielding a wafer processing laminate. The wafer has a pair of opposed surfaces, that is, a front surface where a semiconductor circuit is formed and a back surface where a semiconductor circuit is not formed. The wafer which can be used herein is typically a semiconductor wafer. Suitable semiconductor wafers include silicon wafers, germanium wafers, gallium-arsenic wafers, gallium-phosphorus wafers, and gallium-arsenic-aluminum wafers. Although the thickness of the wafer is not particularly limited, it is typically 600 to 800 μm, more typically 625 to 775 μm.

The support which can be used herein may be selected from substrates such as silicon wafers, glass substrates, and quartz wafers. In the practice of the invention, the support need not be light transmissive because there is no need to irradiate energy radiation to the temporary adhesive layer through the support.

The temporary bond layers (A), (B) and (A') may be pre-formed as films, which may be attached to the wafer or the support. Alternatively, their solutions may be applied to the wafer or the support by a suitable coating technique such as spin coating. After spin coating, prebake is performed at a temperature of 80 to 180° C., depending on the volatility of a particular solvent used. The resulting laminate is ready for use. Alternatively, the layers (A), (A') and (B) in film form may be united together into a layer arrangement, which is sandwiched between the wafer and the support such that layer (A) is contiguous to the wafer and layer (A') is contiguous to the support.

The wafer and support having layers (A), (B) and (A') formed thereon are joined together via layers (A), (B) and (A') into an assembly. The assembly is uniformly compressed preferably at a temperature of 40 to 230° C., more preferably 40 to 200° C. in a vacuum atmosphere to complete a wafer processing laminate. The wafer bonding system used herein includes commercially available wafer bonders such as EVG520IS and 850TB from EV Group, and XBC300 from SUSS MicroTec AG.

Step (b)

Following is step (b) of grinding the non-circuit-forming surface of the wafer bonded to the support. Step (b) is intended to reduce the thickness of the wafer by grinding the wafer back surface of the wafer processing laminate resulting from step (a). As used herein, the term "grinding" refers to grinding, polishing and otherwise machining a workpiece. The technique of grinding the wafer back surface is not particularly limited, and any well-known grinding techniques may be used. The wafer is ground by a grinding wheel (e.g., diamond grinding wheel), while preferably feeding water to the wafer and the wheel for cooling. As the means for grinding the wafer back surface, for example, a surface grinder DAG-8100 by DISCO Co., Ltd. may be used.

Step (c)

Step (c) is for processing the non-circuit-forming surface of the wafer processing laminate which has been ground, i.e., the non-circuit-forming surface of the wafer which has been thinned by back surface grinding (b). This step includes various processes which can be applied on the wafer level, for example, electrode formation, metal conductor formation, and protective film formation. More specifically, any conventional well-known processes may be applied, including metal sputtering for forming electrodes or the like, wet etching of a sputtered metal layer, formation of a pattern (serving as a mask for metal conductor formation) by resist coating, exposure and development, removal of resist, dry etching, metallization, silicon etching for TSV formation, oxide film formation on silicon surface.

Step (d)

Step (d) is for releasing the wafer which has been processed in step (c) from the wafer processing laminate, that is, separating the thin wafer from the wafer processing laminate after processing in step (c) and before dicing. Suitable release procedures for separating the wafer from the support include a sliding procedure (1) of heating them at a suitable temperature, preferably of 200 to 250° C. and sliding them in horizontally opposite directions, a pull-up procedure (2) of holding the wafer or support of the wafer processing laminate horizontally, and pulling up the support or wafer at an angle relative to the horizon, and a peeling procedure (3) of adhering a protective film to the ground surface of the wafer and peeling the protective film together with the wafer from the wafer processing laminate. However, the release procedure is not limited thereto.

Although these release procedures are equally applicable to the invention, preference is given to the pull-up and peeling procedures (2) and (3). The release procedure is generally performed at room temperature.

Step (e)

If the temporary bond layer (A) is partially left on the circuit-forming surface of the wafer after release step (d), step (e) is taken for removing the temporary bond layer (A) from the circuit-forming surface of the wafer. Sometimes the temporary bond layer (A) is partially left on the circuit-forming surface of the wafer which has been released from the support in step (d) and in this event, the layer (A) must be removed. Removal of layer (A) may be performed by washing the wafer, for example.

Step (e) may use any cleaning fluid which is capable of dissolving the thermoplastic organopolysiloxane of which layer (A) is made. Suitable solvents include pentane, hexane, cyclohexane, decane, isododecane, and limonene, which may be used alone or in admixture. If removal is difficult, a base or acid may be added to the solvent. Suitable bases include amines such as ethanolamine, diethanolamine, triethanolamine, triethylamine, and ammonia, and ammonium salts such as tetramethylammonium hydroxide. Suitable acids include organic acids such as acetic acid, oxalic acid, benzenesulfonic acid, and dodecylbenzenesulfonic acid. The base or acid is typically added in such amounts as to give a concentration of 0.01 to 10%, preferably 0.1 to 5% by weight in the cleaning fluid. For more efficient removal of residues, any known surfactants may be added to the cleaning fluid. The washing step may be carried out by agitating the fluid with a puddle, spraying the fluid or immersing in a cleaning fluid bath. The temperature is preferably 10 to 80° C., more preferably 15 to 65° C. The dissolution of layer (A) in the cleaning fluid may be followed by water or alcohol rinsing and drying, yielding a thin wafer.

In the method comprising the steps of bonding the circuit-forming front surface of the wafer to the support via a bonding arrangement consisting of bond layers (A), (B) and (A') to construct a laminate, processing the wafer, and releasing the processed wafer from the support, the step (d) of releasing the processed wafer from the support preferably includes (d-1) attaching a dicing tape to the processed surface of the wafer, (d-2) vacuum chucking the dicing tape-attached surface to a chuck surface, (d-3) releasing the support from the processed wafer by peel-off while keeping the chuck surface at a temperature in the range of 10 to 100° C., and (d-4) removing any bond layer from the circuit-forming surface of the wafer.

EXAMPLE

Examples of the invention are given below by way of illustration and not by way of limitation. Mw is weight average molecular weight as measured by gel permeation chromatography (GPC) versus polystyrene standards.

Resin Synthesis Example 1

A four-necked flask was charged with 1,000 g (3.38 mol) of octamethylcyclotetrasiloxane and 0.24 g (0.0015 mol) of hexamethyldisiloxane and heated at a temperature of 110° C. Then, 4 g of 10 wt % tetrabutylphosphonium hydroxide siliconate was added to the flask whereupon polymerization was performed over 4 hours. The product was post-treated at 160° C. for 2 hours, obtaining dimethylpolysiloxane.

The product was analyzed by $^{29}$Si-NMR spectroscopy to determine the contents of D and M units. It was identified to be a dimethylpolysiloxane of the following structure consisting of 99.978% of D units and 0.022% of M units and having a degree of polymerization of about 9,000.

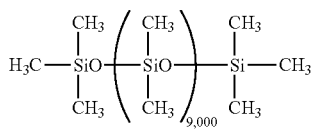

This dimethylpolysiloxane, 500 g, was dissolved in 500 g of hexane. This was poured into 2 L of acetone whereupon a precipitated resin was recovered. On subsequent removal of hexane in vacuum, there was obtained a dimethylpolysiloxane polymer having a Mw of 700,000 and containing 0.05 wt % of a low molecular fraction having a molecular weight of up to 740. This polymer, 20 g, was dissolved in 80 g of isododecane and filtered through a membrane filter with a pore size of 0.2 μm, obtaining an isododecane solution (A-1) of dimethylpolysiloxane.

Resin Synthesis Example 2

A four-necked flask was charged with 1,000 g (3.38 mol) of octamethylcyclotetrasiloxane and 0.93 g (0.003 mol) of tris(trimethylsiloxy)methylsilane and heated at a temperature of 110° C. Then, 4 g of 10 wt % tetrabutylphosphonium hydroxide siliconate was added to the flask whereupon polymerization was performed over 4 hours. The product was post-treated at 160° C. for 2 hours, obtaining dimethylpolysiloxane.

The product was analyzed by $^{29}$Si-NMR spectroscopy to determine the contents of D, M and T units. It was identified to be a branched dimethylpolysiloxane of the following structure consisting of 99.911% of D units, 0.067% of M units, and 0.022% of T units.

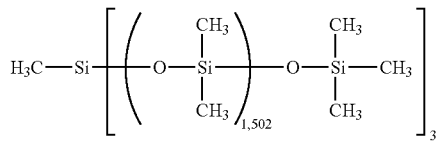

This branched dimethylpolysiloxane, 500 g, was dissolved in 500 g of hexane. This was poured into 2 L of acetone whereupon a precipitated resin was recovered. On subsequent removal of hexane in vacuum, there was obtained a dimethylpolysiloxane polymer having a Mw of 400,000 and containing 0.07 wt % of a low molecular fraction having a molecular weight of up to 740. This polymer, 20 g, was dissolved in 80 g of isododecane and filtered through a membrane filter with a pore size of 0.2 obtaining an isododecane solution (A-2) of dimethylpolysiloxane.

Resin Synthesis Example 3

A flask equipped with a stirrer, thermometer, nitrogen purge line and reflux condenser was charged with 43.1 g of 9,9'-bis(3-allyl-4-hydroxyphenyl)fluorene (M-1), 29.5 g of organohydrogensiloxane having the average structural formula (M-3), 135 g of toluene, and 0.04 g of chloroplatinic acid and heated at 80° C. Then, 17.5 g of 1,4-bis(dimethylsilyl)-benzene (M-5) was added dropwise to the flask over one hour while the flask internal temperature rose to 85° C. At the end of dropwise addition, the reaction solution was aged at 80° C. for 2 hours. Toluene was distilled off, and instead, 80 g of cyclohexanone was added, obtaining a resin solution in cyclohexanone having a resin solid concentration of 50 wt %.

The molecular weight of the resin in the solution was determined by GPC versus polystyrene standards, finding a Mw of 45,000. In formula (1), A=0.9 and B=0.1. To 50 g of the resin solution were added 5 g of hexamethoxymethylol melamine (Nikalac MW-390 by Sanwa Chemical Co., Ltd.) and 0.2 g of bis(t-butylsulfonyl)diazomethane (BSDM by Wako Pure Chemical Industries, Ltd.). Filtration through a membrane filter with a pore size of 0.2 μm yielded a resin solution (B-1).

Resin Synthesis Example 4

In a 5-L flask equipped with a stirrer, thermometer, nitrogen purge line and reflux condenser, 396.9 g of compound (M-1) and 45.0 g of compound (M-2) were dissolved in 1,875 g of toluene. Then 1,269 g of compound (M-3) and 6.1 g of compound (M-4) were added to the flask, which was heated at 60° C. Then 2.2 g of platinum catalyst on carbon (5 wt %) was added. It was seen that the internal temperature rose to 65-67° C. Thereafter, the flask was further heated at 90° C. for 3 hours, and cooled to 60° C. again. Then 2.2 g of platinum catalyst on carbon (5 wt %) was added, and 107.3 g of compound (M-5) was added dropwise to the flask over one hour. At this point, the flask internal temperature rose to 78° C. After the completion of dropwise addition, the reaction solution was aged at 90° C. for 3 hours, cooled to room temperature, poured into 1,700 g of methyl isobutyl ketone (MIBK). The reaction solution was passed through a filter under pressure to remove the platinum catalyst. The resulting polymer solution was combined with 760 g of deionized water, stirred, and allowed to stand for static separation, and the lower or water layer was separated off. This separatory water washing operation was repeated 6 times until the minute amount of acid component was removed from the polymer solution. The solvent was distilled off in vacuum from the resin solution, and instead, 950 g of cyclopentanone was added, obtaining a resin solution in cyclopentanone having a solid concentration of 60 wt %. The molecular weight of the resin in the solution was determined by GPC versus polystyrene standards, finding a Mw of 62,000. In formula (2), the value of (c+d)/(a+b+c+d) is 0.10. To 100 g of the resin solution were added 15 g of epoxy form of cresol-novolak resin (EOCN 1020-55 by Nippon Kayaku Co., Ltd.) and 0.2 g of tetrahydrophthalic anhydride (Rikacid HH-A by New Japan Chemical Co., Ltd.). Filtration through a membrane filter with a pore size of 0.2 μm yielded a resin solution (B-2). In formula (2), values of a, b, c and d are a=0.49, b=0.41, c=0.05, and d=0.05, as calculated from the molar ratio of the reactants.

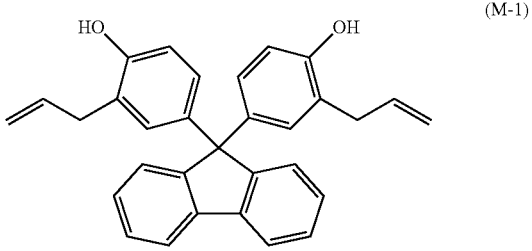

(M-1)

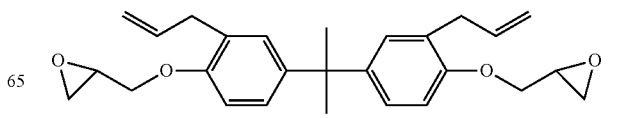

(M-2)

(M-3)
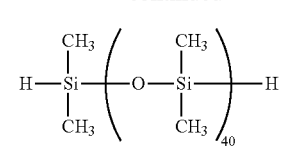

(M-4)
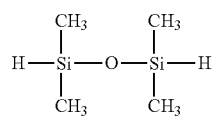

(M-5)
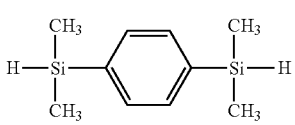

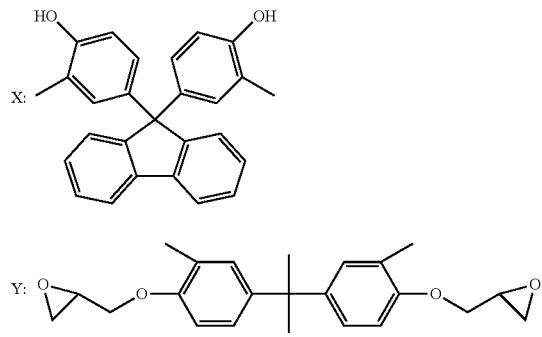

Resin Film Preparation Example 1

The resin solution (A-1) in Resin Synthesis Example 1 was coated onto a polyethylene terephthalate (PET) sheet of 38 μm thick using a blade knife and baked in a dryer at 100° C. for 30 minutes. A film having a thermoplastic polyorganosiloxane layer of 5 μm thick formed on the PET sheet was obtained. Further, the resin solution (B-2) in Resin Synthesis Example 4 was coated onto the polyorganosiloxane layer using a blade knife and baked in a dryer at 90° C. for 30 minutes. A film (B-3) having two resin layers of 70 μm (total thickness) formed on the PET sheet was obtained.

Examples 1 to 3 and Comparative Examples 1, 2

Example 1

The wafer used herein was a silicon wafer (diameter 200 mm, thickness 725 μm) having copper posts (diameter 40 μm, height 10 μm) distributed over its entire surface. Polymer solution (A-1) was spin coated on the bump-formed surface of the wafer to a thickness shown in Table 1.

The support used herein was a glass plate (diameter 200 mm, thickness 500 μm). The resin solution (A-1) was first applied to the support by spin coating, and the resin solution (B-1) was then applied thereon by spin coating. In this way, two layers, polyorganosiloxane layer (A') and modified siloxane layer (B) were formed on the support. Every resin coating was followed by heat treatment on a hot plate at 120° C. for 2 minutes.

Using a vacuum wafer bonder, the silicon wafer having a resin layer was joined to the glass plate having a resin layer, with their resin layers mated together, under the pressure bonding condition shown in Table 1. A laminate was obtained in this way. It is noted that although a glass plate is used herein as the support so that the laminate may be visually inspected for defects, a wafer or substrate which is not transmissive to light may be used.

The laminate was examined by the following tests, with the results shown in Table 1.

Example 2

A laminate was prepared as in Example 1 except that resin solution (A-2) was used as layer (A), and resin solution (B-2) was used as layer (B).

Example 3

In this Example, film (B-3) consisting of layers (B) and (A') was used. A film having a thickness shown in Table 1 was shaped by laminating the polyorganosiloxane layer to the glass support by a vacuum laminator TEAM-100 (Takatori Co., Ltd.) at a wafer stage temperature of 100° C. and in a vacuum of 100 Pa, holding for 10 seconds, and opening to air. Thereafter, the film was bonded to layer (A) as in Example 1, obtaining a laminate.

Comparative Example 1

A laminate was prepared as in Example 1 except that layer (B) was omitted.

Comparative Example 2

A laminate was prepared as in Example 1 except that layer (B) was formed directly on the wafer of Example 1.

[Adhesion Test]

Using a wafer bonder EVG520IS of EV Group, a wafer with a diameter of 200 mm was bonded to a support under conditions including a bonding temperature as shown in Table 1, a chamber internal pressure of less than $10^{-3}$ mbar, and a load of 5 kN. After bonding, the laminate was heated in an oven at 180° C. for 1 hour for curing layer (B). After cooling to room temperature, the interfacial bond state was observed by the following method to judge the sample.

The sample was evaluated good when no defectives like bubbles were found at the interface, and poor when defectives were found.

The total resin thickness in the laminated wafer was measured by using TTV (Total Thickness Variation) measurement apparatus to judge the thickness distribution to the center thickness as follows:

5% or less of the thickness distribution is good, and more than 5% of the thickness distribution is bad.

[Back Surface Grinding Test]

The back surface of a silicon wafer was ground by a grinder DAG810 of DISCO Co., Ltd. having a diamond abrasive wheel. After the wafer was ground to a final thickness of 50 μm, it was observed for defectives such as cracks and dislodgment under an optical microscope (100×). The sample was evaluated good when no defectives were found, and poor when defectives were found.

[Heat Resistance Test]

After the silicon wafer had been ground, the laminate was placed in a nitrogen atmosphere oven at 250° C. for 2 hours and then heated on a hot plate at 270° C. for 10 minutes to observe the outer appearance of the laminate for anomaly. When the anomaly was not found by the heating at 270° C., the laminate was further heated at 300° C. for 10 minutes to evaluate the heat resistance. The temperature at which no appearance anomalies were found was shown in Table 1. The sample which passed the heat resistance test at 270° C. was evaluated good.

[Peel Test]

The wafer release ability was evaluated. After the wafer was thinned to 50 μm, a dicing tape was applied to the wafer side using a dicing frame. The dicing tape was set to the chuck platen by vacuum chucking. At room temperature, the glass plate was peeled by pulling it up at one point using a pair of tweezers. The sample was evaluated good when the glass was peeled without breakage of the 50-μm wafer and poor when fissure or other anomalies occurred.

[Clean-Up Test]

After the peel test, the 200-mm wafer mounted on the dicing frame via the dicing tape (which had been exposed to the heat resistance test conditions) was set on a spin coater, with the adhesive layer upside. Isododecane as cleaning fluid was sprayed for 3 minutes. Rinsing was performed by spraying isopropyl alcohol (IPA) while spinning the wafer. The outer appearance of the wafer was visually observed for any residual adhesive resin. The sample was evaluated whether residual resin was absent or present. In this case, when the residual resin was present for the 3-minute clean-up, isododecane was further sprayed for 2 minutes. The sample was evaluated good in the absence of residual resin for the total spraying time of isododecane of 5 minutes.

TABLE 1

|  | Example | | | Comparative Example | |
| --- | --- | --- | --- | --- | --- |
|  | 1 | 2 | 3 | 1 | 2 |
| Resin layer (A) | A-1 | A-2 | A-1 | A-1 | not formed |
| Layer (A) thickness | 5 μm | 7 μm | 3 μm | 5 μm | — |
| Resin layer (B) | B-1 | B-2 | B-3 | not formed | B-1 |
| Layer (B) thickness | 30 μm | 50 μm | 75 μm (B + A') | — | 30 μm |
| Resin layer (A') | A-1 | A-1 | included in B-3 | A-2 | A-1 |
| Layer (A') thickness | 2 μm | 5 μm | — | 7 μm | 2 μm |
| Bonding temperature | 160° C. | 120° C. | 120° C. | 100° C. | 160° C. |
| Adhesion | no void TTV = 2.5% good | no void TTV = 3.0% good | no void TTV = 3.2% good | no void TTV = 8.5% poor | no void TTV = 2.8% good |
| Resistance to back surface grinding | no crack no breakage good | no crack no breakage good | no crack no breakage good | breakage poor | no crack no breakage good |
| Heat resistance | 300° C. good | 300° C. good | 270° C. good | — | 300° C. good |
| Peel test | no crack good | no crack good | no crack good | — | no crack good |
| Clean-up test | 3 minutes good | 3 minutes good | 3 minutes good | — | residual resin at 5 minutes poor |

Japanese Patent Application No. 2011-236960 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A wafer processing laminate comprising a support, a temporary adhesive layer on the support, and a wafer laid contiguous to the temporary adhesive layer, the wafer having a circuit-forming front surface and a back surface to be processed, said temporary adhesive layer comprising a composite temporary adhesive unit having a trilayer structure consisting of a first temporary bond layer (A) of thermoplastic organosiloxane polymer which is releasably bonded to the front surface of the wafer, a second temporary bond layer (B) of thermosetting modified siloxane polymer which is laid contiguous to the first temporary bond layer, and a third temporary bond layer (A') of thermoplastic organosiloxane polymer which is laid contiguous to the second temporary bond layer and releasably bonded to the support, wherein the first and third temporary bond layers (A) and (A') each comprise a thermoplastic organopolysiloxane polymer consisting of difunctional siloxane units of $R^{11}R^{12}SiO_{2/2}$, monofunctional siloxane units of $R^{13}R^{14}R^{15}SiO_{1/2}$, and as optional recurring units trifunctional siloxane units of $R^{16}SiO_{3/2}$, wherein $R^{11}$, $R^{12}$, $R^{13}$, $R^{14}$, $R^{15}$, and $R^{16}$ are each independently a substituted or unsubstituted monovalent hydrocarbon group, wherein the first and third temporary bond layers (A) and (A') each have a thickness in the range of 0.1 to 10 μm.

2. The wafer processing laminate of claim 1 wherein the first and third temporary bond layers (A) and (A') each comprise the thermoplastic organopolysiloxane polymer consisting of 99.000 to 99.999 mol % of difunctional siloxane units of $R^{11}$, $R^{12}$, $SiO_{2/2}$, 1.000 to 0.001 mol % of monofunctional siloxane units of $R^{13}R^{14}R^{15}SiO_{1/2}$, and 0.000 to 0.500 mol % of trifunctional siloxane units of $R^{16}SiO_{3/2}$, wherein $R^{11}$, $R^{12}$, $R^{13}$, $R^{14}$, $R^{15}$, and $R^{16}$ are each independently a substituted or unsubstituted monovalent hydrocarbon group, the organopolysiloxane having a weight average molecular weight of 200,000 to 1,000,000, and containing up to 0.5% by weight of a low molecular fraction having a molecular weight of up to 740.

3. The wafer processing laminate of claim 1 wherein the second temporary bond layer (B) is a cured layer of a composition comprising 100 parts by weight of a thermosetting modified siloxane polymer which is a silphenylene-containing polymer comprising recurring units of the general formula (1) and having a weight average molecular weight of 3,000 to 500,000 or an epoxy-containing silicone polymer comprising recurring units of the general formula (2) and having a weight average molecular weight of 3,000 to 500,000, and 0.1 to 50 parts by weight of a crosslinker which is selected from the group consisting of an amino condensate modified with formalin or formalin-alcohol, a melamine resin, a urea resin, a phenol compound having on average at least two methylol or alkoxymethylol groups per molecule, and an epoxy compound having on average at least two epoxy groups per molecule,

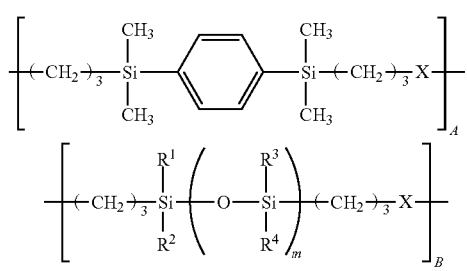

(1)

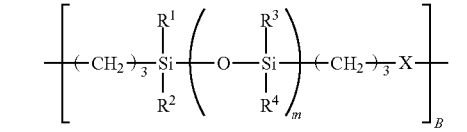

wherein $R^1$ to $R^4$ are each independently a monovalent hydrocarbon group of 1 to 8 carbon atoms, m is an integer of 1 to 100, A is a positive number, B is 0 or a positive number, X is a divalent organic group having the general formula (3):

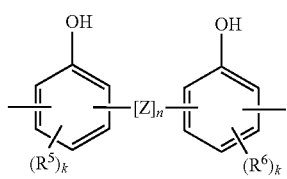

(3)

wherein Z is a divalent organic group selected from the following:

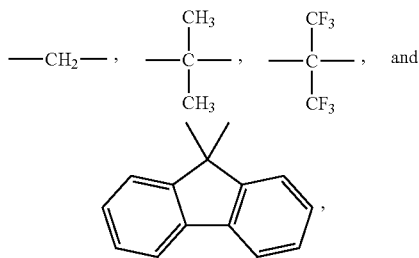

n is 0 or 1, $R^5$ and $R^6$ are each independently an alkyl or alkoxy group of 1 to 4 carbon atoms, and k is 0, 1 or 2,

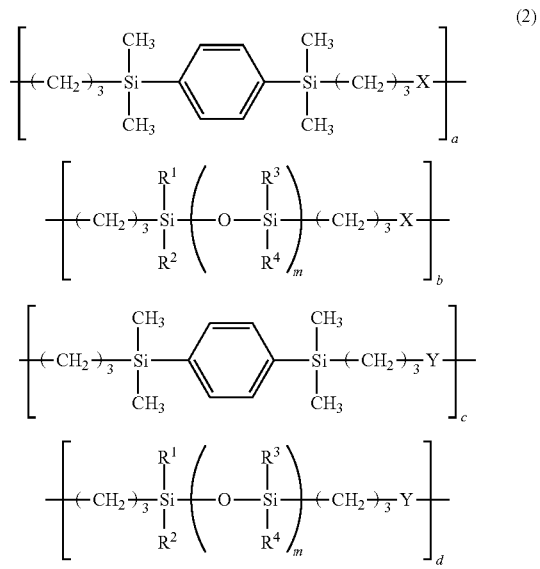

(2)

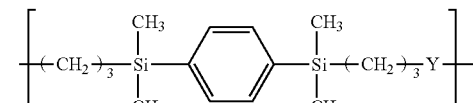

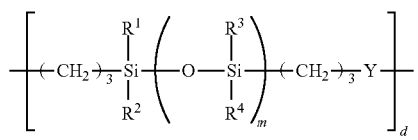

wherein $R^1$ to $R^4$ are each independently a monovalent hydrocarbon group of 1 to 8 carbon atoms, m is an integer of 1 to 100, a, b, c and d each are 0 or a positive number, with the proviso that c and d are not equal to 0 at the same time, and $0 < (c+d)/(a+b+c+d) \leq 1.0$, X is a divalent organic group having the general formula (3):

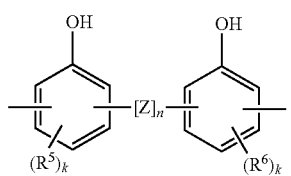

(3)

wherein Z is a divalent organic group selected from the following:

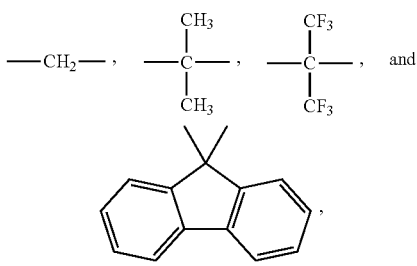

n is 0 or 1, $R^5$ and $R^6$ are each independently an alkyl or alkoxy group of 1 to 4 carbon atoms, and k is 0, 1 or 2, and Y is a divalent organic group having the general formula (4):

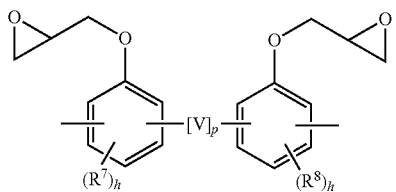
(4)

wherein V is a divalent organic group selected from the following:

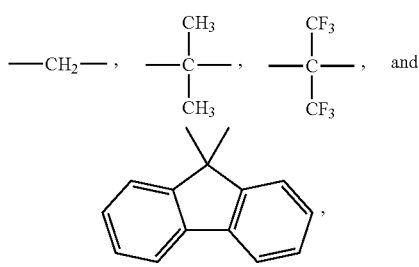

p is 0 or 1, $R^7$ and $R^8$ are each independently an alkyl or alkoxy group of 1 to 4 carbon atoms, and h is 0, 1 or 2.

4. The wafer processing laminate of claim 1 wherein the second temporary bond layer (B) is a cured layer of a composition comprising 100 parts by weight of a thermosetting modified siloxane polymer which is an epoxy-containing silicone polymer consisting of recurring units of the general formula (2) and having a weight average molecular weight of 3,000 to 500,000, and 0.1 to 50 parts by weight of a crosslinker which is selected from the group consisting of an amino condensate modified with formalin or formalin-alcohol, a melamine resin, a urea resin, a phenol compound having on average at least two methylol or alkoxymethylol groups per molecule, and an epoxy compound having on average at least two epoxy groups per molecule,

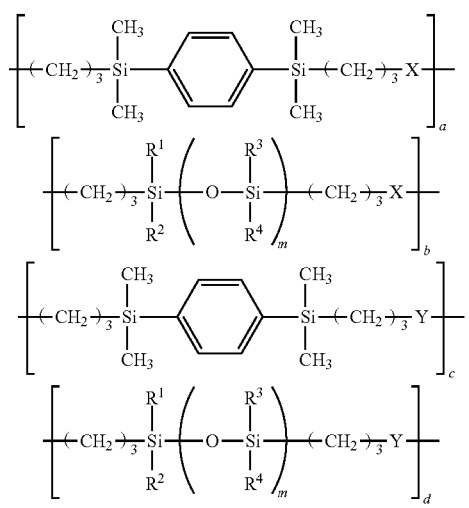

wherein $R^1$ to $R^4$ are each independently a monovalent hydrocarbon group of 1 to 8 carbon atoms, m is an integer of 1 to 100, a, b, c and d each are 0 or a positive number, with the proviso that c and d are not equal to 0 at the same time, and $0<(c+d)/(a+b+c+d)\le 1.0$, X is a divalent organic group having the general formula (3):

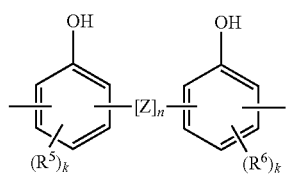

wherein Z is a divalent organic group selected from the following:

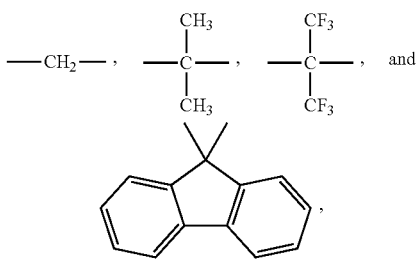

n is 0 or 1, $R^5$ and $R^6$ are each independently an alkyl or alkoxy group of 1 to 4 carbon atoms, and k is 0, 1 or 2, and Y is a divalent organic group having the general formula (4):

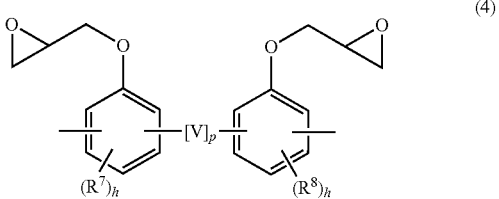

wherein V is a divalent organic group selected from the following:

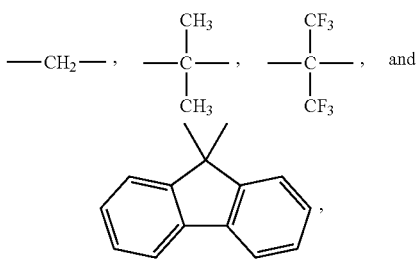

p is 0 or 1, $R^7$ and $R^8$ are each independently an alkyl or alkoxy group of 1 to 4 carbon atoms, and h is 0, 1 or 2.

5. A wafer processing member comprising a support and a temporary adhesive layer on the support, wherein a wafer having a circuit-forming front surface and a back surface to be processed can be temporarily bonded to the temporary adhesive layer, said temporary adhesive layer comprising a third temporary bond layer (A') of thermoplastic organosiloxane polymer which is releasably bonded to the support, a second temporary bond layer (B) of thermosetting modified siloxane polymer which is laid contiguous to the third temporary bond layer, and a first temporary bond layer (A) of thermoplastic organosiloxane polymer which is laid contiguous to the second temporary bond layer and which can be releasably bonded to the front surface of the wafer, wherein the first and third temporary bond layers (A) and (A') each comprise a thermoplastic organopolysiloxane polymer consisting of difunctional siloxane units of $R^{11}R^{12}SiO_{2/2}$, monofunctional siloxane units of $R^{13}R^{14}R^{15}SiO_{1/2}$, and as optional recurring units trifunctional siloxane units of $R^{16}SiO_{3/2}$, wherein $R^{11}$, $R^{12}$, $R^{13}$, $R^{14}$, $R^{15}$, and $R^{16}$ are each independently a substituted or unsubstituted monovalent hydrocarbon group, wherein the first and third temporary bond layers (A) and (A') each have a thickness in the range of 0.1 to 10 μm.

6. The wafer processing member of claim 5 wherein the first and third temporary bond layers (A) and (A') each comprise the thermoplastic organopolysiloxane polymer consisting of 99.000 to 99.999 mol % of difunctional siloxane units of $R^{11}R^{12}SiO_{2/2}$, 1.000 to 0.001 mol % of monofunctional siloxane units of $R^{13}R^{14}R^{15}SiO_{1/2}$, and 0.000 to 0.500 mol 1% of trifunctional siloxane units of $R^{16}SiO_{3/2}$, wherein $_R{}^{11}$, $R^{12}$, $R^{13}$, $R^{14}$, $R^{15}$, and $R^{16}$ are each independently a substituted or unsubstituted monovalent hydrocarbon group, the organopolysiloxane having a weight average molecular weight of 200,000 to 1,000,000, and containing up to 0.5% by weight of a low molecular fraction having a molecular weight of up to 740.

7. The wafer processing member of claim 5 wherein the second temporary bond layer (B) is a cured layer of a composition comprising 100 parts by weight of a thermosetting modified siloxane polymer which is a silphenylene-containing polymer comprising recurring units of the general formula (1) and having a weight average molecular weight of 3,000 to 500,000 or an epoxy-containing silicone polymer comprising recurring units of the general formula (2) and having a weight average molecular weight of 3,000 to 500,000, and 0.1 to 50 parts by weight of a crosslinker which is selected from the group consisting of an amino condensate modified with formalin or formalin-alcohol, a melamine resin, a urea resin, a phenol compound having on average at least two methylol or alkoxymethylol groups per molecule, and an epoxy compound having on average at least two epoxy groups per molecule,

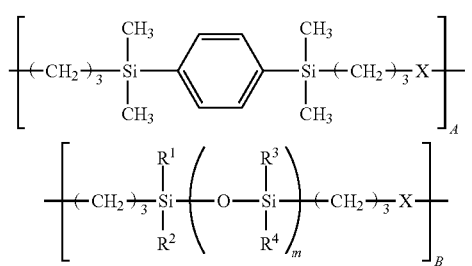

wherein $R^1$ to $R^4$ are each independently a monovalent hydrocarbon group of 1 to 8 carbon atoms, m is an integer of 1 to 100, A is a positive number, B is 0 or a positive number, X is a divalent organic group having the general formula (3):

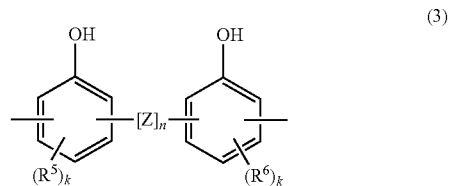

wherein Z is a divalent organic group selected from the following:

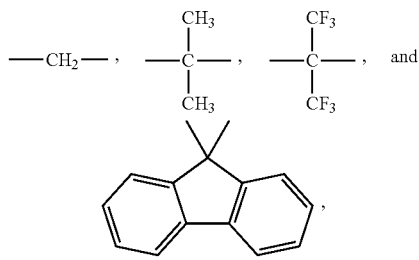

n is 0 or 1, $R^5$ and $R^6$ are each independently an alkyl or alkoxy group of 1 to 4 carbon atoms, and k is 0, 1 or 2,

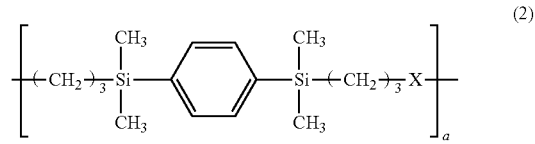

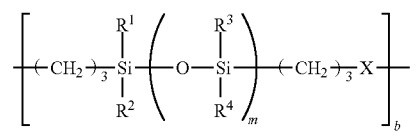

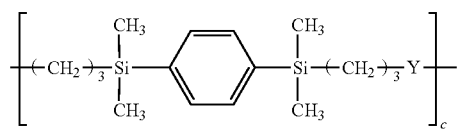

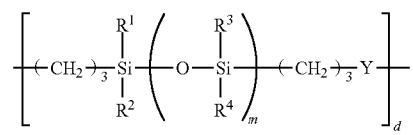

wherein $R^1$ to $R^4$ are each independently a monovalent hydrocarbon group of 1 to 8 carbon atoms, m is an integer of 1 to 100, a, b, c and d each are 0 or a positive number, with the proviso that c and d are not equal to 0 at the same time, and $0<(c+d)/(a+b+c+d)\leq1.0$, X is a divalent organic group having the general formula (3):

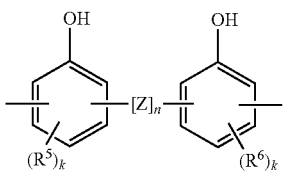

wherein Z is a divalent organic group selected from the following:

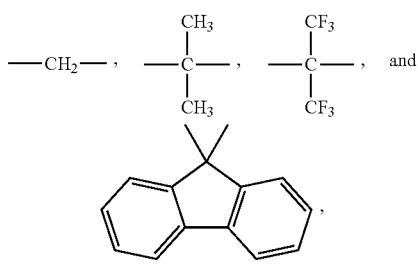

n is 0 or 1, $R^5$ and $R^6$ are each independently an alkyl or alkoxy group of 1 to 4 carbon atoms, and k is 0, 1 or 2, and Y is a divalent organic group having the general formula (4):

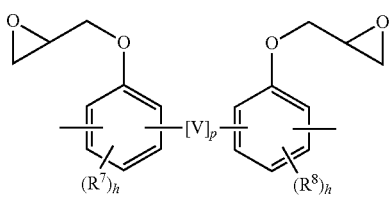

wherein V is a divalent organic group selected from the following:

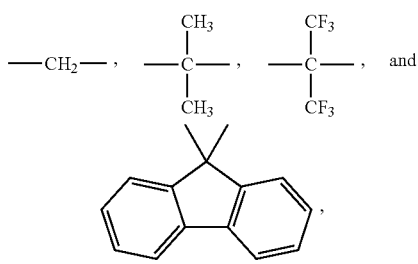

p is 0 or 1, $R^7$ and $R^8$ are each independently an alkyl or alkoxy group of 1 to 4 carbon atoms, and h is 0, 1 or 2.

8. The wafer processing member of claim 5 wherein the second temporary bond layer (B) is a cured layer of a composition comprising 100 parts by weight of a thermosetting modified siloxane polymer which is an epoxy-containing silicone polymer consisting of recurring units of the general formula (2) and having a weight average molecular weight of 3,000 to 500,000, and 0.1 to 50 parts by weight of a crosslinker which is selected from the group consisting of an amino condensate modified with formalin or formalin-alcohol, a melamine resin, a urea resin, a phenol compound having on average at least two methylol or alkoxymethylol groups per molecule, and an epoxy compound having on average at least two epoxy groups per molecule,

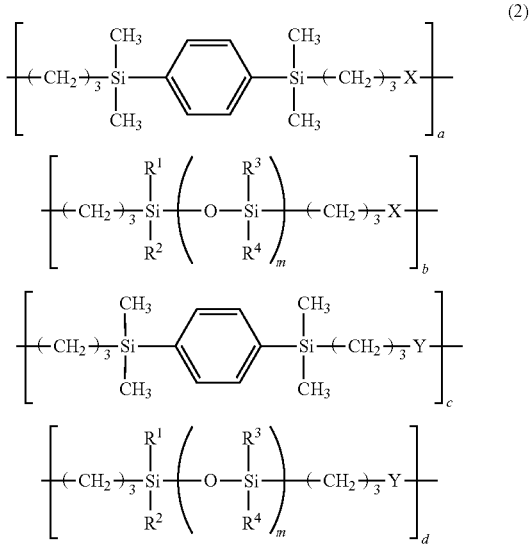

wherein $R^1$ to $R^4$ are each independently a monovalent hydrocarbon group of 1 to 8 carbon atoms, m is an integer of 1 to 100, a, b, c and d each are 0 or a positive number, with the proviso that c and d are not equal to 0 at the same time, and $0<(c+d)/(a+b+c+d)\leq1.0$, X is a divalent organic group having the general formula (3):

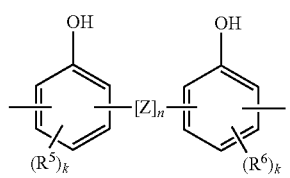

wherein Z is a divalent organic group selected from the following:

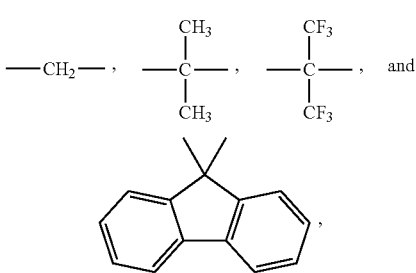

n is 0 or 1, $R^5$ and $R^6$ are each independently an alkyl or alkoxy group of 1 to 4 carbon atoms, and k is 0, 1 or 2, and Y is a divalent organic group having the general formula (4):

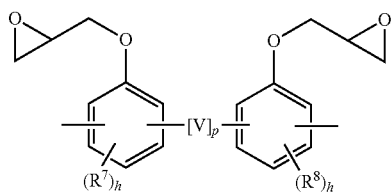
(4)

wherein V is a divalent organic group selected from the following:

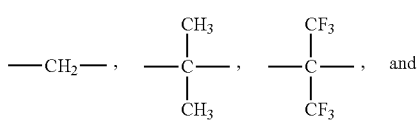

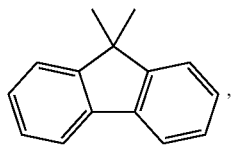

p is 0 or 1, $R^7$ and $R^8$ are each independently an alkyl or alkoxy group of 1 to 4 carbon atoms, and h is 0, 1 or 2.

9. An arrangement for temporarily bonding a wafer to a support for wafer processing, the wafer having a circuit-forming front surface and a back surface to be processed,
said temporary bonding arrangement consisting of a first temporary bond layer (A) of thermoplastic organosiloxane polymer which can be releasably bonded to the front surface of the wafer, a second temporary bond layer (B) of thermosetting modified siloxane polymer which is laid contiguous to the first temporary bond layer, and a third temporary bond layer (A') of thermoplastic organosiloxane polymer which is laid contiguous to the second temporary bond layer and which can be releasably bonded to the support,
wherein the first and third temporary bond layers (A) and (A') each comprise a thermoplastic organopolysiloxane polymer consisting of difunctional siloxane units of $R^{11}R^{12}SiO_{2/2}$, monofunctional siloxane units of $R^{13}R^{14}R^{15}SiO_{1/2}$, and as optional recurring units trifunctional siloxane units of $R^{16}SiO_{3/2}$, wherein $R^{11}$, $R^{14}$, $R^{15}$, and $R^{16}$ are each independently a substituted or unsubstituted monovalent hydrocarbon group,
wherein the first and third temporary bond layers (A) and (A') each have a thickness in the range of 0.1 to 10 μm.

10. The temporary bonding arrangement of claim 9 wherein the first and third temporary bond layers (A) and (A') each comprise the thermoplastic organopolysiloxane polymer consisting of 99.000 to 99.999 mol % of difunctional siloxane units of $R^{11}R^{12}SiO_{2/2}$, 1.000 to 0.001 mol % of monofunctional siloxane units of $R^{13}R^{14}R^{15}SiO_{1/2}$, and 0.000 to 0.500 mol % of trifunctional siloxane units of $R^{16}SiO_{3/2}$, wherein $R^{11}$, $R^{12}$, $R^{13}$, $R^{14}$, $R^{15}$, and $R^{16}$ are each independently a substituted or unsubstituted monovalent hydrocarbon group, the organopolysiloxane having a weight average molecular weight of 200,000 to 1,000,000, and containing up to 0.5% by weight of a low molecular fraction having a molecular weight of up to 740.

11. The temporary bonding arrangement of claim 9 wherein the second temporary bond layer (B) is a cured layer of a composition comprising 100 parts by weight of a thermosetting modified siloxane polymer which is a silphenylene-containing polymer comprising recurring units of the general formula (1) and having a weight average molecular weight of 3,000 to 500,000 or an epoxy-containing silicone polymer comprising recurring units of the general formula (2) and having a weight average molecular weight of 3,000 to 500,000, and 0.1 to 50 parts by weight of a crosslinker which is selected from the group consisting of an amino condensate modified with formalin or formalin-alcohol, a melamine resin, a urea resin, a phenol compound having on average at least two methylol or alkoxymethylol groups per molecule, and an epoxy compound having on average at least two epoxy groups per molecule,

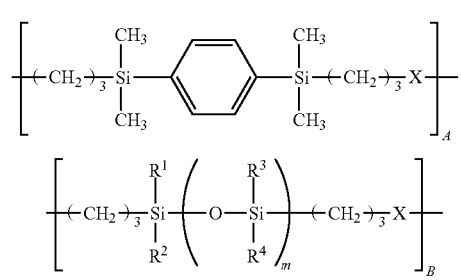

wherein $R^1$ to $R^4$ are each independently a monovalent hydrocarbon group of 1 to 8 carbon atoms, m is an integer of 1 to 100, A is a positive number, B is 0 or a positive number, X is a divalent organic group having the general formula (3):

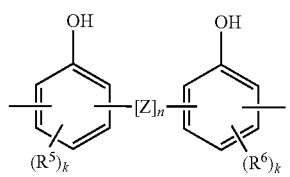

wherein Z is a divalent organic group selected from the following:

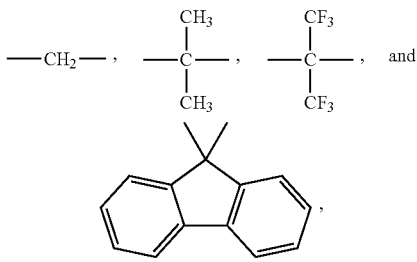

n is 0 or 1, $R^5$ and $R^6$ are each independently an alkyl or alkoxy group of 1 to 4 carbon atoms, and k is 0, 1 or 2,

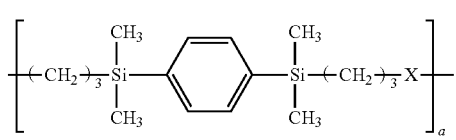   (2)

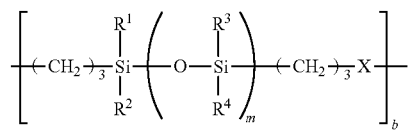

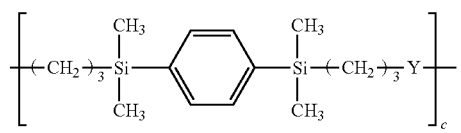

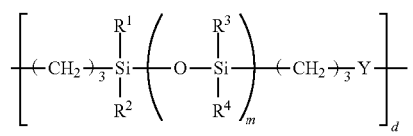

wherein $R^1$ to $R^4$ are each independently a monovalent hydrocarbon group of 1 to 8 carbon atoms, m is an integer of 1 to 100, a, b, c and d each are 0 or a positive number, with the proviso that c and d are not equal to 0 at the same time, and $0<(c+d)/(a+b+c+d)\le 1.0$, X is a divalent organic group having the general formula (3):

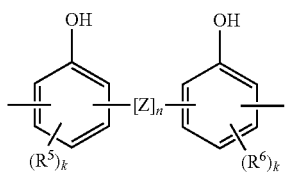   (3)

wherein Z is a divalent organic group selected from the following:

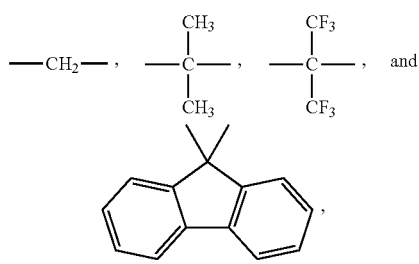

n is 0 or 1, $R^5$ and $R^6$ are each independently an alkyl or alkoxy group of 1 to 4 carbon atoms, and k is 0, 1 or 2, and Y is a divalent organic group having the general formula (4):

   (4)

wherein V is a divalent organic group selected from the following:

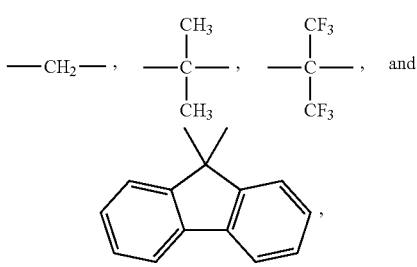

p is 0 or 1, $R^7$ and $R^8$ are each independently an alkyl or alkoxy group of 1 to 4 carbon atoms, and h is 0, 1 or 2.

12. The temporary bonding arrangement of claim 9 wherein the second temporary bond layer (B) is a cured layer of a composition comprising 100 parts by weight of a thermosetting modified siloxane polymer which is an epoxy-containing silicone polymer consisting of recurring units of the general formula (2) and having a weight average molecular weight of 3,000 to 500,000, and 0.1 to 50 parts by weight of a crosslinker which is selected from the group consisting of an amino condensate modified with formalin or formalin-alcohol, a melamine resin, a urea resin, a phenol compound having on average at least two methylol or alkoxymethylol groups per molecule, and an epoxy compound having on average at least two epoxy groups per molecule,

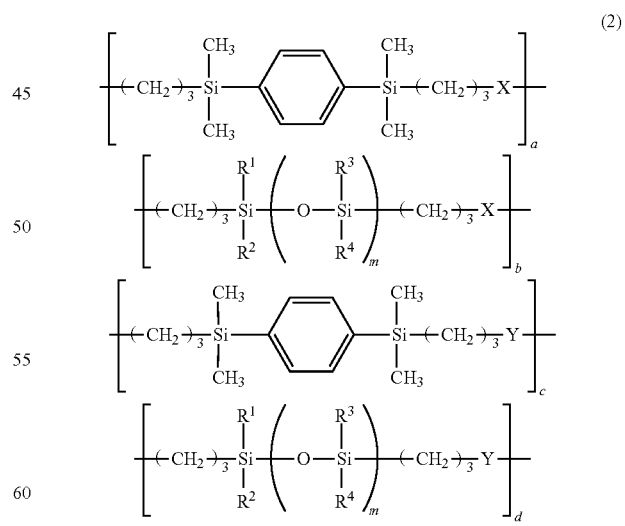   (2)

wherein $R^1$ to $R^4$ are each independently a monovalent hydrocarbon group of 1 to 8 carbon atoms, m is an integer of 1 to 100, a, b, c and d each are 0 or a positive number, with the proviso that c and d are not equal to 0 at the same time, and $0<(c+d)/(a+b+c+d)\le 1.0$, X is a divalent organic group having the general formula (3):

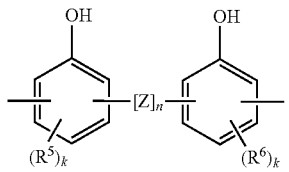

wherein Z is a divalent organic group selected from the following:

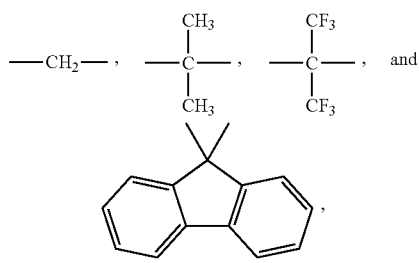

n is 0 or 1, $R^5$ and $R^6$ are each independently an alkyl or alkoxy group of 1 to 4 carbon atoms, and k is 0, 1 or 2, and
Y is a divalent organic group having the general formula (4):

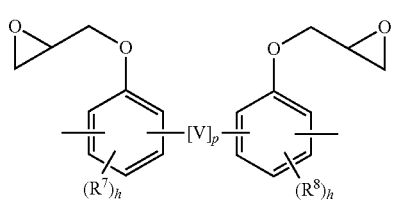

wherein V is a divalent organic group selected from the following:

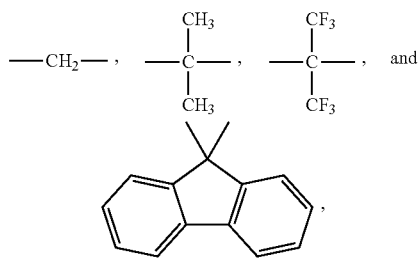

p is 0 or 1, $R^7$ and $R^8$ are each independently an alkyl or alkoxy group of 1 to 4 carbon atoms, and h is 0, 1 or 2.

13. A method for manufacturing a thin wafer, comprising the steps of:
 (a) releasably bonding a wafer to a support via a composite temporary bonding arrangement having a trilayer structure consisting of bond layers (A), (B) and (A') as set forth in any one of claims 1 to 3, the wafer having a circuit-forming front surface and a non-circuit-forming back surface, with the circuit-forming surface facing the support,
 (b) grinding the non-circuit-forming surface of the wafer bonded to the support,
 (c) processing the non-circuit-forming surface of the wafer,
 (d) releasing the processed wafer from the support, and
 (e) optionally removing any bond layer from the circuit-forming surface of the wafer.

14. A method for manufacturing a thin wafer, the wafer having a circuit-forming front surface and a non-circuit-forming back surface, comprising the steps of:
 (a) forming bond layer (A) on the circuit-forming surface of the wafer, successively forming bond layers (A') and (B) on a support, and bonding bond layer (A) to bond layer (B) thereby bonding the wafer and the support together, wherein bond layers (A), (B), and (A') are as set forth in any one of claims 1 to 3,
 (b) grinding the non-circuit-forming surface of the wafer bonded to the support,
 (c) processing the non-circuit-forming surface of the wafer,
 (d) releasing the processed wafer from the support, and
 (e) optionally removing any bond layer from the circuit-forming surface of the wafer.

15. A method for manufacturing a thin wafer, comprising the steps of bonding a wafer to a support via a bonding arrangement consisting of bond layers (A), (B) and (A') as set forth in any one of claims 1 to 3, the wafer having a circuit-forming front surface and a non-circuit-forming back surface, with the circuit-forming front surface of the wafer facing the support, processing the wafer, and releasing the processed wafer from the support,
 the step (d) of releasing the processed wafer from the support including
 (d-1) attaching a dicing tape to the processed surface of the wafer,
 (d-2) vacuum chucking the dicing tape-attached surface to a chuck surface,
 (d-3) releasing the support from the processed wafer by peel-off while keeping the chuck surface at a temperature in the range of 10 to 100° C., and
 (d-4) removing any bond layer from the circuit-forming surface of the wafer.

* * * * *